United States Patent
Yang

(10) Patent No.: US 8,997,840 B2
(45) Date of Patent: Apr. 7, 2015

(54) HEAT-DISSIPATING UNIT HAVING A HYDROPHILIC COMPOUND FILM AND METHOD FOR DEPOSITING A HYDROPHILIC COMPOUND FILM

(75) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 767 days.

(21) Appl. No.: 13/045,772

(22) Filed: Mar. 11, 2011

(65) Prior Publication Data

US 2012/0227936 A1    Sep. 13, 2012

(51) Int. Cl.
*B05D 5/04*        (2006.01)
*H01L 23/427*      (2006.01)
*F28D 15/02*       (2006.01)
*F28D 15/04*       (2006.01)
*F28F 13/06*       (2006.01)

(52) U.S. Cl.
CPC ............... *B05D 5/04* (2013.01); *H01L 23/427* (2013.01); *B05D 2202/00* (2013.01); *F28F 13/06* (2013.01); *F28D 15/0233* (2013.01); *F28D 15/046* (2013.01); *H01L 2924/0002* (2013.01); *F28F 2245/02* (2013.01)

(58) Field of Classification Search
USPC ........... 165/104.26, 104.33, 133; 361/679.52, 361/700
See application file for complete search history.

(56) References Cited

U.S. PATENT DOCUMENTS

| | | | |
|---|---|---|---|
| 2006/0191671 A1* | 8/2006 | Boger et al. ................. | 165/133 |
| 2007/0056711 A1* | 3/2007 | Ohsawa ................. | 165/104.21 |
| 2007/0056714 A1* | 3/2007 | Wong ................. | 165/104.26 |
| 2007/0068657 A1* | 3/2007 | Yamamoto et al. ...... | 165/104.26 |
| 2007/0240860 A1* | 10/2007 | Meyer et al. ............ | 165/104.26 |
| 2008/0210407 A1* | 9/2008 | Kim et al. ................. | 165/104.26 |
| 2009/0242177 A1* | 10/2009 | Morioka et al. ............ | 165/133 |
| 2010/0012300 A1* | 1/2010 | Moon et al. ............ | 165/104.26 |
| 2010/0243214 A1* | 9/2010 | Moon et al. ............ | 165/104.26 |
| 2010/0258278 A1* | 10/2010 | Moon et al. ............ | 165/104.26 |

\* cited by examiner

*Primary Examiner* — Mohammad M Ali
*Assistant Examiner* — Raheena Rehman
(74) *Attorney, Agent, or Firm* — Jackson IPG PLLC

(57) ABSTRACT

A heat-dissipating unit having a hydrophilic compound film and a method for depositing a hydrophilic compound film are disclosed. The heat-dissipating unit includes a metallic body having a chamber and a working fluid. The chamber has a liquid-guiding structure constituted of an evaporating portion, a condensing portion and a connecting portion. At least one hydrophilic compound film is coated on surfaces of the chamber and the liquid-guiding structure. By this arrangement, the flowing of the working fluid in the heat-dissipating unit is enhanced to improve the heat-conducting efficiency of the heat-dissipating unit.

14 Claims, 7 Drawing Sheets

HEAT-DISSIPATING UNIT HAVING A HYDROPHILIC COMPOUND FILM AND METHOD FOR DEPOSITING A HYDROPHILIC COMPOUND FILM

BACKGROUND OF THE INVENTION

1. Field of the Invention

The present invention relates to a heat-dissipating unit having a hydrophilic compound film and a method for depositing a hydrophilic compound film, and in particular to a heat-dissipating unit having a hydrophilic compound film with an improved heat-conducting efficiency and a method for depositing such a hydrophilic compound film.

2. Description of Prior Art

Since the operating speed of a modern electronic apparatus becomes higher, more heat is generated by the electronic apparatus and accumulated therein to raise its operating temperature. Thus, people pay more attention to the heat dissipation of electronic elements and chips because the electronic apparatus may break down or overheat if the heat accumulated therein cannot be dissipated to the outside efficiently.

Thus, people try to mount a heat sink, a heat-dissipating module or a fan on the electronic elements and chips for heat dissipation. Further, people also like to use heat pipes because they are very effective in heat conduction. The heat pipe is made of copper or aluminum material. The interior of the heat pipe is provided with a chamber. A wick structure is formed on the inner surface of the chamber. One end of the heat pipe is sealed first and a working fluid is filled in the heat pipe through the other end thereof (i.e., the non-sealed end). Then, a degassing process is performed to make the interior of the heat pipe become a vacuum. Finally, the non-sealed end is sealed to form a vacuum sealed chamber. The heat pipe is often made into a tubular pipe or flat pipe. The wick structure within the heat pipe plays an important role in determining the heat-conducting efficiency of the heat pipe. Especially, the flat heat pipe requires the wick structure to have a large capillary force and a small resistance to liquid flow. However, these two properties seem conflicting in terms of the construction of the heat pipe. In order to solve this conflicting problem, the wick structure is usually treated for improving its surface property. In general, the wick structure is surface-treated to have a better wettability to increase the capillary force of the heat pipe. The most effective way is to form nano-scale microstructures on the surface of the wick structure. For example, the nano-scale microstructures may be made by an etching process, in which a chemical solution is used to etch micro-pits on the surface of the wick structure. However, it is uneasy to control the etching rate of such an etching process. Further, the pollution of the chemical solution is also troublesome.

Taiwan Patent Publication No. I292028 discloses a heat pipe and a method for manufacturing the same. The heat pipe includes a hollow tubular casing having two sealed ends. The inner surface of the hollow tubular casing is formed with a liquid-absorbing core. The surface of the liquid-absorbing core is formed with a hydrophilic coating. A liquid fluid is filled in the liquid-absorbing core and sealed in the hollow tubular casing. The hydrophilic coating includes nano-$TiO_2$, nano-ZnO, nano-$Al_2O_3$ or the mixture thereof. The thickness of the hydrophilic coating is in a range of 10 to 200 nanometers, preferably 20 to 50 nanometer.

This patent document discloses a heat-conducting coating formed on the outer surface of the hollow tubular casing. The heat-conducting coating includes a nano-scale film made of carbon, copper, aluminum, or copper-aluminum alloy. The thickness of the heat-conducting coating is in a range of 10 to 500 nanometers, preferably 20 to 300 nanometers.

The liquid-absorbing core includes nano-scale carbon balls or carbon fibers. The thickness of the liquid-absorbing core is in a range of 0.1 to 0.5 millimeters, preferably 0.2 to 0.3 millimeters.

The method for manufacturing the heat pipe includes the steps of: providing a hollow tubular casing, forming a liquid-absorbing core on inner surfaces of the hollow tubular casing, forming a hydrophilic coating on the surface of the liquid-absorbing core; and sealing a working fluid in the hollowing tubular casing and making the interior of the hollow tubular casing vacuum.

The inner and outer surfaces of the hollow tubular casing are surface-treated by a laser texturing process.

The hydrophilic coating is made by a vacuum film deposition method.

However, the above conventional art has to utilize expensive apparatuses and inevitably increases its production cost. Therefore, it has problems of (1) complicated production, (2) high cost, and (3) expensive facilities.

SUMMARY OF THE INVENTION

In order to solve the above problems, a primary objective of the present invention is to provide a heat-dissipating unit having a hydrophilic compound film, which is capable of increasing its heat-conducting efficiency.

The other object of the present invention is to provide a method for depositing a hydrophilic compound film of a heat-dissipating unit.

In order to achieve the above objectives, the present invention is to provide a heat-dissipating unit having a hydrophilic compound film, including: a metallic body having a chamber, the chamber having an evaporating portion, a condensing portion, a connecting portion and a hydrophilic compound film, the interior of the chamber being filled with a working fluid, the evaporating portion being provided in the chamber and having a plurality of first liquid-guiding portions, the first liquid-guiding portions being constituted of a plurality of first liquid-guiding bodies arranged at intervals, at least one first channel being formed between the first liquid-guiding bodies, at least one end of the first channel being a free end connected to a free region, the condensing portion being provided in the chamber opposite to the evaporating portion, the interior of the condensing portion having a plurality of second liquid-guiding portions, the second liquid-guiding portions being constituted of a plurality of liquid-guiding bodies arranged at intervals, at least one second channel being formed between the second liquid-guiding bodies, the connecting portion being provided between the evaporating portion and the condensing portion, the connecting portion having at least one communication hole set and at least one second communication hole set, the first and second communication hole sets being in communication with the evaporating portion and the condensing portion, the hydrophilic compound film being coated on the evaporating portion, the condensing portion, the connecting portion, and the surface of the chamber.

The present invention further provides a method for depositing a hydrophilic compound film of a heat-dissipating unit, including steps of: providing a heat-dissipating unit having a chamber and a liquid-guiding structure, and coating at least one hydrophilic compound film on the surfaces of the chamber and the liquid-guiding structure of the heat-dissipating unit.

Since the surfaces of the chamber and the liquid-guiding structure of the heat-dissipating unit are deposited with at least one hydrophilic compound film, the working fluid can flow in the heat-dissipating unit more smoothly to thereby increase the heat-conducting efficiency.

DETAILED DESCRIPTION OF THE INVENTION

Figure 1:
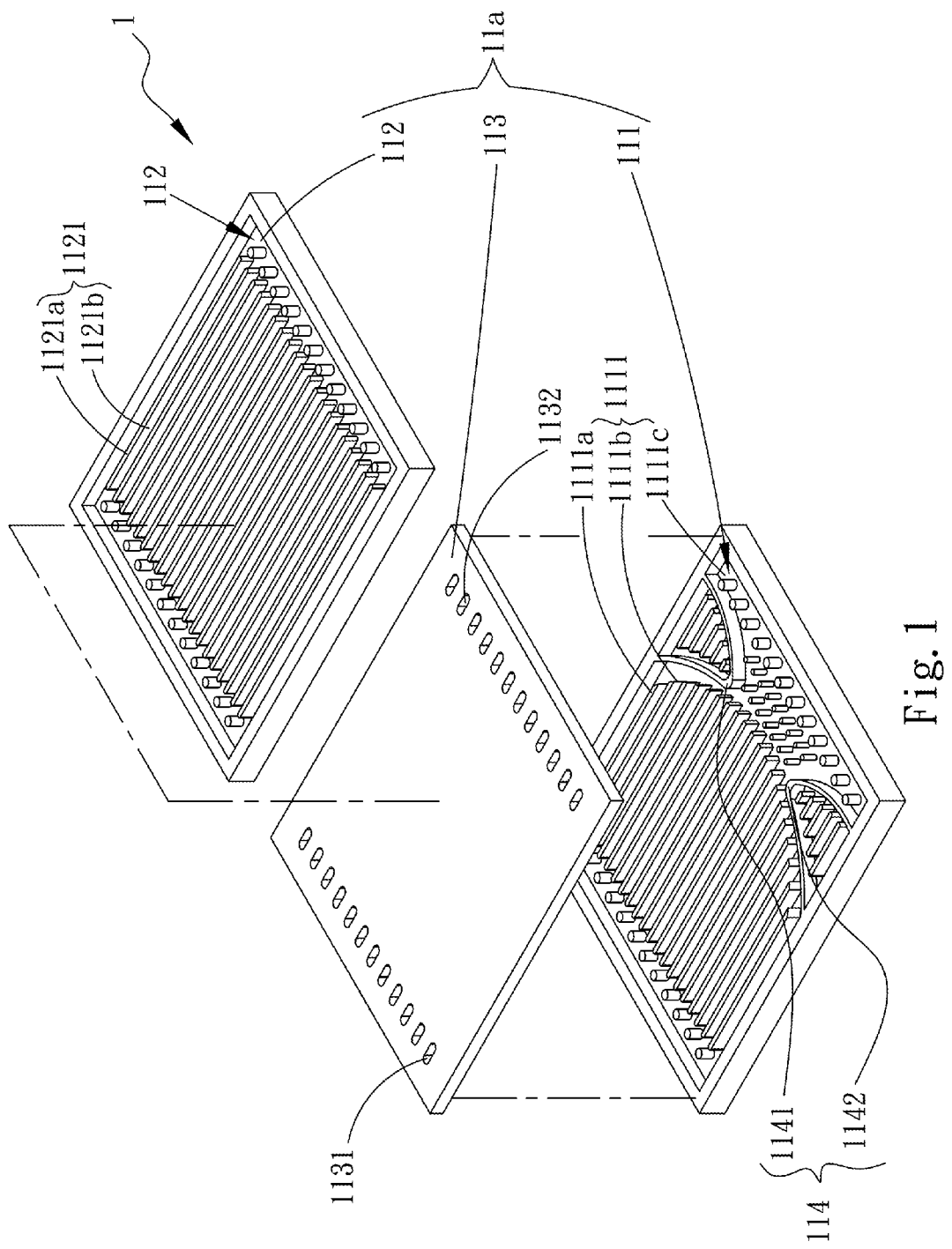
FIG. 1 is an exploded perspective view showing the heat-dissipating unit having a hydrophilic compound film in accordance with a preferred embodiment of the present invention.
Figure 2:
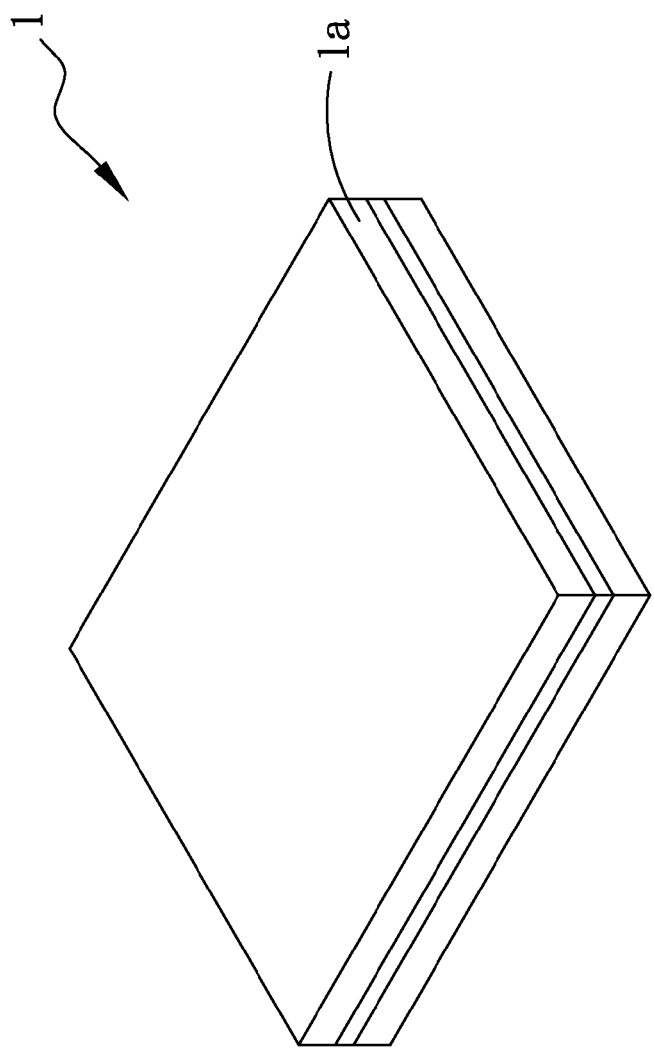
FIG. 2 is an assembled perspective view showing the heat-dissipating unit having a hydrophilic compound film in accordance with the preferred embodiment of the present invention.
Figure 3:
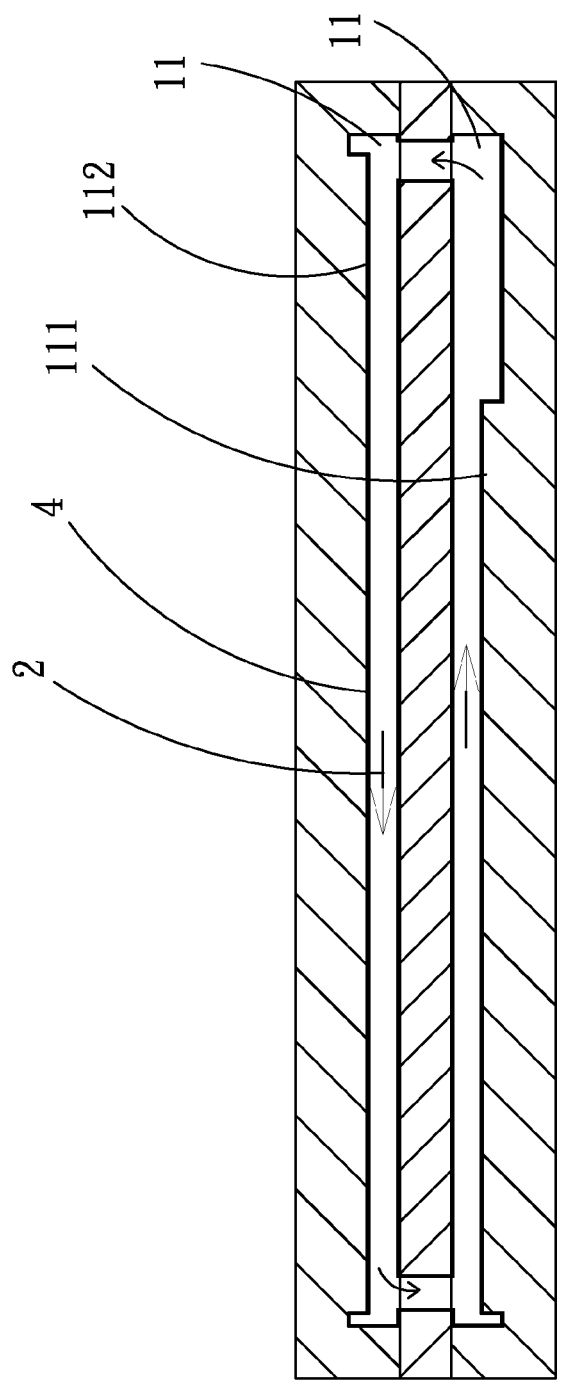
FIG. 3 is a cross-sectional view showing the heat-dissipating unit having a hydrophilic compound film in accordance with the preferred embodiment of the present invention.

The above objectives and structural and functional features of the present invention will be described in more detail with reference to preferred embodiments thereof shown in the accompanying drawings Please refer to FIGS. 1 to 3. FIG. 1 is an exploded perspective view showing the heat-dissipating unit having a hydrophilic compound film in accordance with a preferred embodiment of the present invention. FIG. 2 is an assembled perspective view showing the heat-dissipating unit having a hydrophilic compound film in accordance with the preferred embodiment of the present invention. FIG. 3 is a cross-sectional view showing the heat-dissipating unit having a hydrophilic compound film in accordance with the preferred embodiment of the present invention. The heat-dissipating unit 1 having a hydrophilic compound unit comprises a metallic body 1a having a chamber 11. The chamber 11 has an evaporating portion 111, a condensing portion 112, a connecting portion 113, and a hydrophilic compound film 4. The interior of the chamber 11 has a working fluid 2.

The evaporating portion 111, the condensing portion 112 and the connecting portion 113 define a liquid-guiding structure 11a.

The evaporating portion 111 is provided in the chamber 11. The evaporating portion 111 has a plurality of first liquid-guiding portions 1111. The first liquid-guiding portions 1111 are constituted of a plurality of first liquid-guiding bodies 1111a arranged at intervals. At least one first channel 1111b is formed between the first liquid-guiding bodies 1111a. At least one end of the first channel 1111b is a free end connected to a free region 1111c. The first liquid-guiding body 1111a is formed into an elongate rib. The elongate ribs are arranged transversely at intervals. The first channel 1111b is formed between the elongate ribs. A guiding portion 114, including a first guiding element 1141 and a second guiding element 1142, is formed between the first liquid-guiding bodies 1111a and the at least one first channel 1111b and the free region 1111c and defines gradual narrow channels.

The condensing portion 112 is provided in the chamber 11 opposite to the evaporating portion 111. The interior of the condensing portion 112 has a plurality of second liquid-guiding portions 1121. The second liquid-guiding portions 1121 are constituted of a plurality of second liquid-guiding bodies 1121a arranged at intervals. At least one second channel 1121b is formed between the second liquid-guiding bodies 1121a. The second liquid-guiding body 1121a is formed into an elongate rib. The elongate ribs are arranged transversely at intervals. The first channel 111b is formed between the elongate ribs.

The connecting portion 113 is provided between the evaporating portion 111 and the condensing portion 112. The connecting portion 113 has at least one first communication hole set 1131 and at least one second communication hole set 1132. The first communication hole set 1131 and the second communication hole set 1132 are in communication with the evaporating portion 111 and the condensing portion 112.

The hydrophilic compound film 4 is coated on the evaporating portion 111, the condensing portion 112, the connecting portion 113 and the surface of the chamber 11.

The hydrophilic compound film 4 may be any one of oxides or sulfides. The oxides may be any one selected from a group including $SiO_2$, $TiO_2$, $Al_2O_3$, $ZrO_2$, $CaO$, $K_2O$, $ZnO$.

The heat-dissipating unit 1 may be any one of a vapor chamber, a flat heat pipe, and a loop heat pipe. In the present embodiment, a vapor chamber is used as an example, but the heat-dissipating unit 1 is not limited thereto.

The metallic body 1a is any one selected from a group including copper, aluminum, nickel and stainless steel.

Figure 4:
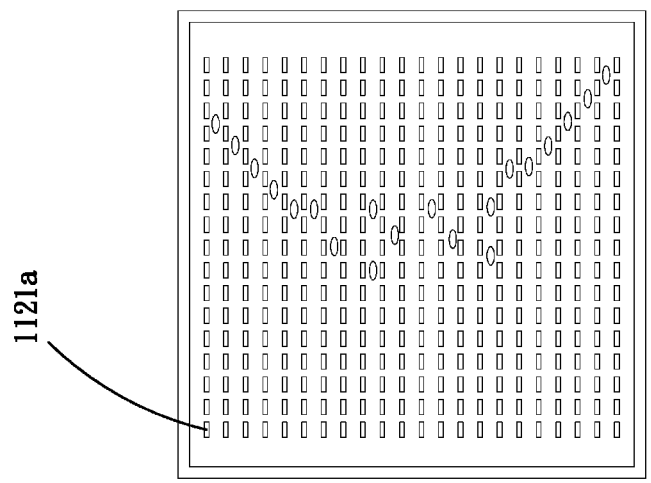
FIG. 4 is a top view showing an evaporating portion of the heat-dissipating unit having a hydrophilic compound film in accordance with a second embodiment of the present invention.
Figure 5:
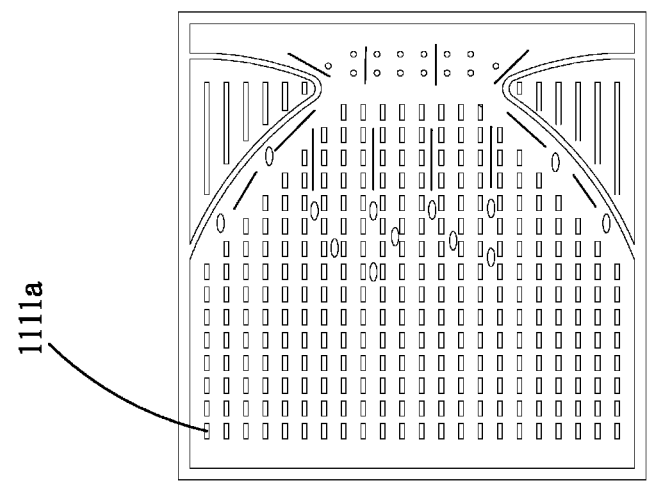
FIG. 5 is a bottom view showing a condensing portion of the heat-dissipating unit having a hydrophilic compound film in accordance with the second embodiment of the present invention.

Please refer to FIGS. 4 and 5. FIG. 4 is a top view showing the evaporating portion of the heat-dissipating unit having a hydrophilic compound film in accordance with the second embodiment of the present invention, and FIG. 5 is a bottom view showing the condensing portion of the heat-dissipating unit having a hydrophilic compound film in accordance with the second embodiment of the present invention. The structural relationship among the components of the second embodiment is substantial to that of the first embodiment, so that the redundant description is omitted for simplicity. The difference between the second embodiment and the first embodiment lies in that: the first liquid-guiding bodies 1111a are longitudinally arranged at intervals. The second liquid-guiding portions 1121a are longitudinally arranged at intervals.

Figure 7:
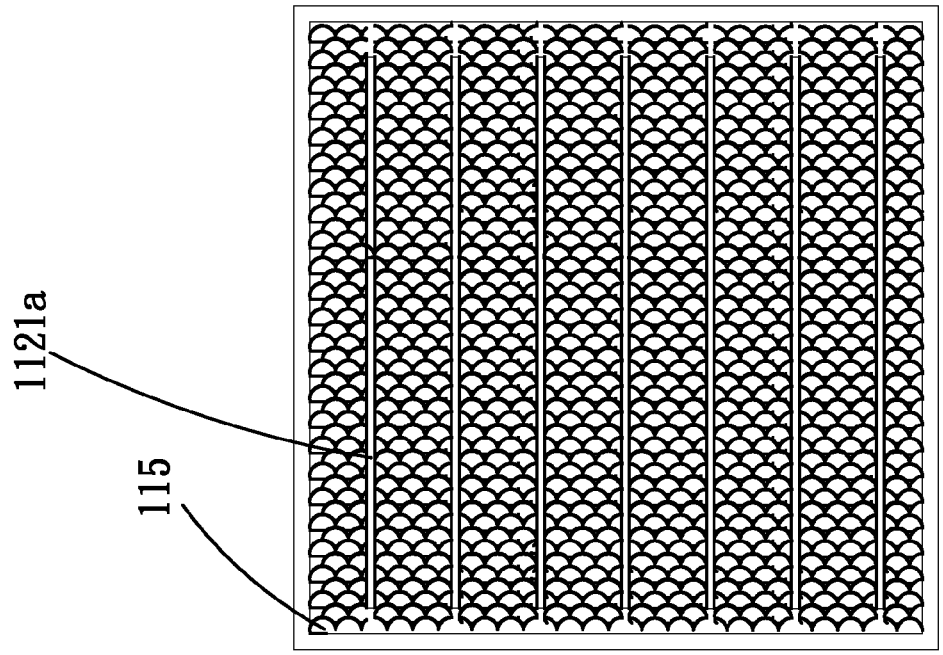
FIG. 7 is a bottom view showing a condensing portion of the heat-dissipating unit having a hydrophilic compound film in accordance with the third embodiment of the present invention.
Figure 6:
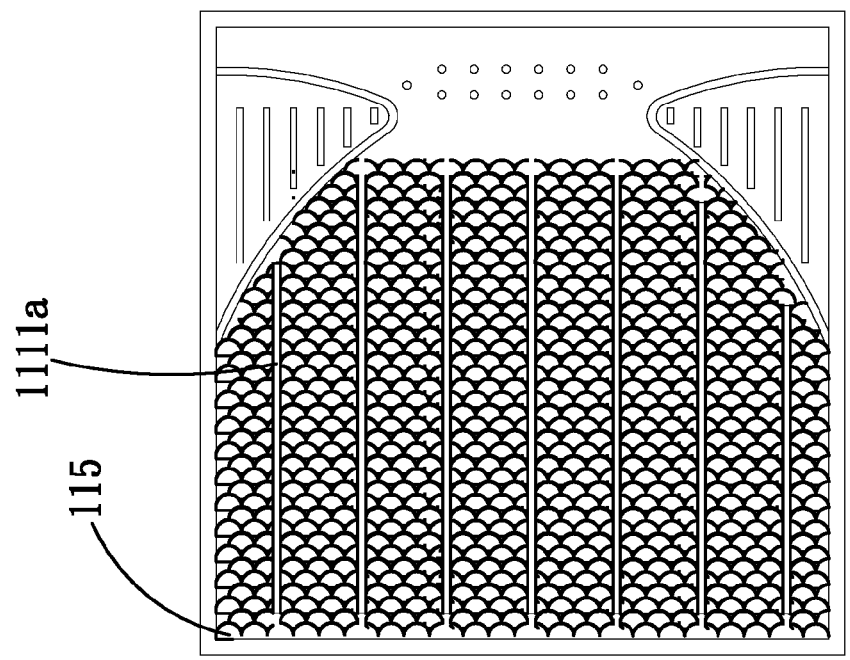
FIG. 6 is a top view showing an evaporating portion of the heat-dissipating unit having a hydrophilic compound film in accordance with a third embodiment of the present invention.

Please refer to FIGS. 6 and 7. FIG. 6 is a top view showing an evaporating portion of the heat-dissipating unit having a hydrophilic compound film in accordance with the third embodiment of the present invention, and FIG. 7 is a bottom view showing a condensing portion of the heat-dissipating unit having a hydrophilic compound film in accordance with the third embodiment of the present invention. The structural relationship among the components of the third embodiment is substantial to that of the second embodiment, so that the redundant description is omitted for simplicity. The difference between the third embodiment and the second embodiment lies in that: the first liquid-guiding bodies 111a and the second liquid-guiding bodies 1121a are provided with a plurality of pits 115. The pits 115 may be each shaped as a circle, square, triangle or other shape. In the present embodiment, each of the pits 115 is shaped as a fish-scale shape, but it is not limited thereto.

Figure 8:
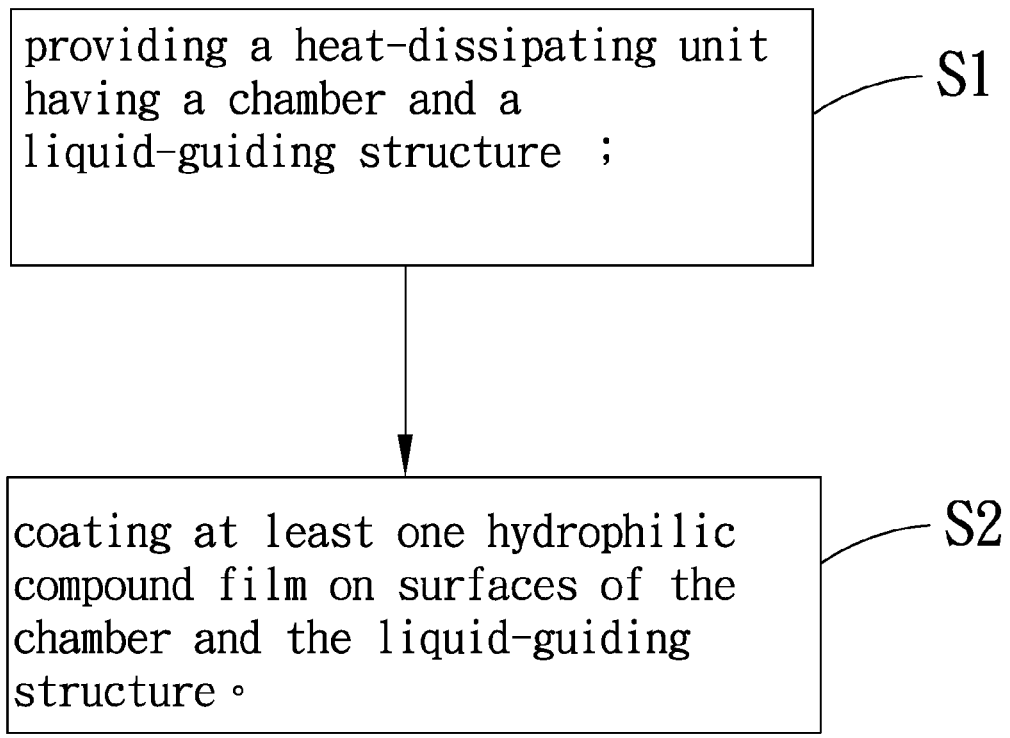
FIG. 8 is a flow chart showing the method for depositing a hydrophilic compound film of the heat-dissipating unit in accordance with the present invention.
Figure 9:
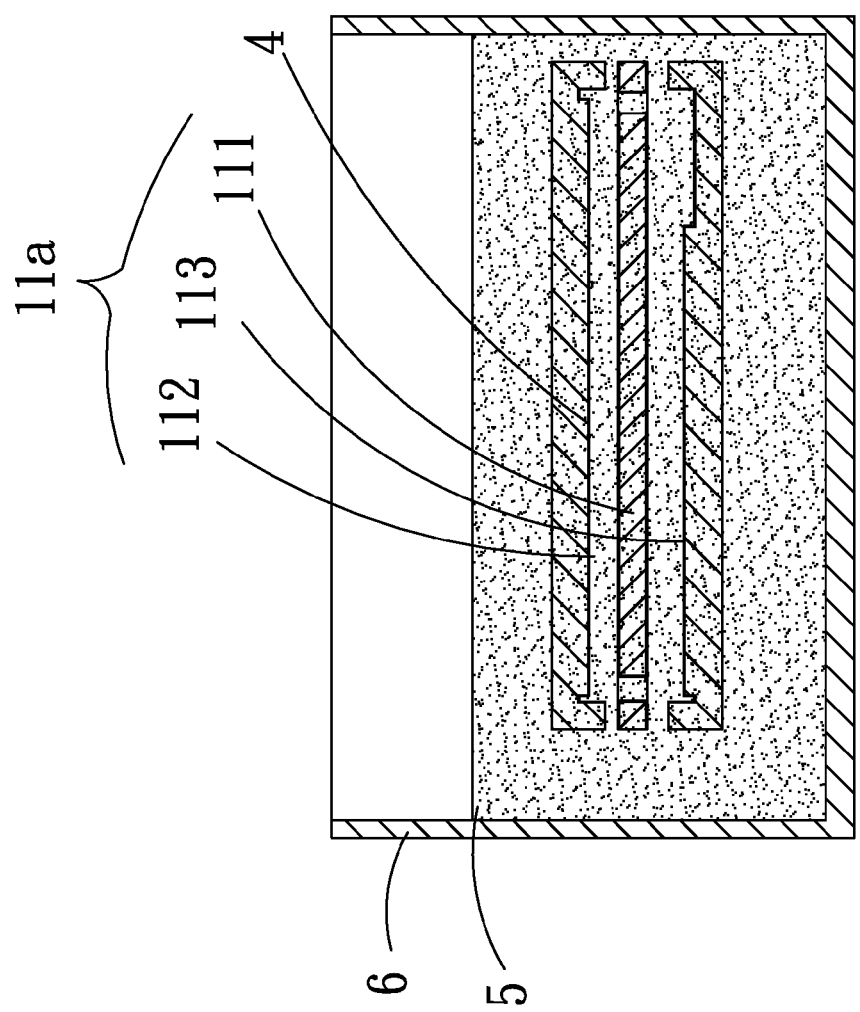
FIG. 9 is a schematic view showing the manufacturing of the hydrophilic compound film of the heat-dissipating unit in accordance with the present invention.

Please refer to FIGS. 8 and 9. FIG. 8 is a flow chart showing the method for depositing a hydrophilic compound film of the heat-dissipating unit in accordance with the present invention, and FIG. 9 is a schematic view showing the manufacturing of the hydrophilic compound film of the heat-dissipating unit in accordance with the present invention. Please also refer to FIGS. 1 to 7. The method for depositing a hydrophilic compound film of the heat-dissipating unit includes a step S1 of providing a heat-dissipating unit having a chamber and a liquid-guiding structure, and a step S2 of coating at least one hydrophilic compound film on surfaces of the chamber and the liquid-guiding structure of the heat-dissipating unit.

In the step S1, a heat-dissipating unit 1 having a chamber 11 and a liquid-guiding structure 11a is provided. The heat-dissipating unit 1 may be a heat-pipe, a vapor chamber, a flat heat pipe, a loop heat pipe or the like. In the present embodiment, the vapor chamber is used as an example of the heat-dissipating unit 1, but it is not limited thereto.

In the step S2, the surfaces of the chamber 11 and the liquid-guiding structure 11a are coated with at least one hydrophilic compound film 4. The hydrophilic compound film 4 may be oxides or sulfides. The oxides may be any one selected from a group including $SiO_2$, $TiO_2$, $Al_2O_3$, $ZrO_2$, CaO, $K_2O$ and ZnO. In the present embodiment, the hydrophilic compound film 4 is made of Al2O3, but it not limited thereto.

In the heat-dissipating unit 1 of the present invention, the hydrophilic compound film 4 is made by a physical vapor deposition method (PVD) and a sol gel method. In the present embodiment, the sol gel method is used as an example, but it is not limited thereto. The sol gel method may be performed by a precipitating, spin coating, brushing, wetting or soaking process. In the present embodiment, the soaking process is used as an example of the sol gel method for coating the hydrophilic compound film 4, but the soaking process is not limited thereto. In the sol gel method, Al2O3 particles are soaked in an aqueous solution 5. The aqueous solution 5 and the Al2O3 particles are poured in a tank 6 and dispersed therein uniformly. A portion of the heat-dissipating unit 1 having the liquid-guiding structure 11a is soaked in the aqueous solution 5 of the tank 6. Then, the heat-dissipating unit 1 is disposed in the aqueous solution 5 of the tank 6. Finally, the heat-dissipating unit 1 is taken out of the aqueous solution 5 or the aqueous solution 5 is drained from the tank 6 in such a manner that the $Al_2O_3$ particles are adhered to the surface of the liquid-guiding structure 11a (FIG. 9).

The heat-dissipating unit 1 mentioned in the previous embodiments may be any one of a vapor chamber, a flat heat pipe and a loop heat pipe.

What is claimed is:

1. A heat-dissipating unit having a hydrophilic compound film, including a metallic body having a chamber and a working fluid, the chamber having:

an evaporating portion provided in the chamber, the evaporating portion having
   a plurality of first liquid-guiding portions, each first liquid-guiding portion being constituted of a plurality of elongate first liquid-guiding bodies arranged at intervals and extending in a first direction in a major plane of the evaporating portion and from a first wall of the chamber only partially across the evaporating portion, at least one first channel being formed between the first liquid-guiding bodies and extending in the first direction, one end of the first channel being a free end connected to a free region, wherein the free region is defined as a region between terminal ends of the first liquid-guiding portions and an opposite second wall of the chamber, and a guiding portion provided in the evaporating portion, the guiding portion having a first guiding element and a second guiding element, wherein the first guiding element and the second guiding element respectively extend centrally from third and fourth opposed walls of the chamber generally transverse to the first direction and in the major plane of the evaporating portion and wherein the first and second guiding elements each taper inwardly as extending inwardly from the respective third and fourth opposed walls of the chamber to form a necked opening between the first liquid-guiding portions and the at least one first channel and the free region;

a condensing portion provided in the chamber opposite to the evaporating portion, the condensing portion having a plurality of second liquid-guiding portions therein, the second liquid-guiding portions being constituted of a plurality of elongate second liquid-guiding bodies arranged at intervals, at least one second channel being formed between the second liquid-guiding portions;

a connecting portion provided between the evaporating portion and the condensing portion, the connecting portion having at least one first communication hole set and at least one second communication hole set, the first communication hole set and the second communication hole set being in communication with the evaporating portion and the condensing portion, the evaporating portion, the condensing portion and the connecting portion defining a liquid-guiding structure; and a hydrophilic compound film coated on the evaporating portion, the condensing portion, the connecting portion and a surface of the chamber.

2. The heat-dissipating unit having a hydrophilic compound film according to claim 1, wherein the heat-dissipating unit is any one of a vapor chamber, a flat heat pipe and a loop heat pipe.

3. The heat-dissipating unit having a hydrophilic compound film according to claim 1, wherein the hydrophilic compound film is an oxide.

4. The heat-dissipating unit having a hydrophilic compound film according to claim 1, wherein the hydrophilic compound film is a sulfide.

5. The heat-dissipating unit having a hydrophilic compound film according to claim 3, wherein the oxide is one selected from a group including $SiO_2$, $TiO_2$, $Al_2O_3$, $ZrO_2$, CaO, $K_2O$ and ZnO.

6. The heat-dissipating unit having a hydrophilic compound film according to claim 1, wherein the metallic body is one selected from the group consisting of copper, aluminum, nickel and stainless steel.

7. The heat-dissipating unit having a hydrophilic compound film according to claim 1, wherein each of the first liquid-guiding bodies is an elongated rib, the elongated ribs are arranged at intervals, and the first channel is formed between the elongated ribs.

8. The heat-dissipating unit having a hydrophilic compound film according to claim 1, wherein each of the second liquid-guiding bodies is an elongated rib, the elongated ribs are arranged at intervals, and the second channel is formed between the elongated ribs.

9. The heat-dissipating unit having a hydrophilic compound film according to claim 1, wherein the first liquid-guiding bodies and the second liquid-guiding bodies have a plurality of pits.

10. The heat-dissipating unit having a hydrophilic compound film according to claim 9, wherein each of the pits is shaped as one of a circle, a square, a triangle and a fish scale.

11. A method for depositing a hydrophilic compound film of a heat-dissipating unit, including steps of:
provided a heat-dissipating unit having a metallic body with a chamber and a working fluid, the chamber having an evaporating portion provided in the chamber, the evaporating portion having a plurality of first liquid-guiding portions, each first liquid-guiding portion being constituted of a plurality of elongate first liquid-guiding bodies arranged at intervals and extending in a first direction in a major plane of the evaporating portion and from a first wall of the chamber only partially across the evaporating portion, at least one first channel being formed between the first liquid-guiding bodies and extending in the first direction, one end of the first channel being a free end connected to a free region, wherein the free region is defined as a region between terminal ends of the first liquid-guiding portions and an opposite second wall of the chamber, and a guiding portion provided in the evaporating portion, the guiding portion having a first guiding element and a second guiding element, wherein the first guiding element and the second guiding element respectively extend centrally from third and fourth opposed walls of the chamber generally transverse to the first direction and in the major plane of the evaporating portion and wherein the first and second guiding elements each taper inwardly as extending inwardly from the respective third and fourth opposed walls of the chamber to form a necked opening between the first liquid-guiding portions and the at least one first channel and the free region;

a condensing portion provided in the chamber opposite to the evaporating portion, the condensing portion having a plurality of second liquid-guiding portions therein, the second liquid-guiding portions being constituted of a plurality of elongate second liquid-guiding bodies arranged at intervals, at least one second channel being formed between the second liquid-guiding portions;

a connecting portion provided between the evaporating portion and the condensing portion, the connecting portion having at least one first communication hole set and at least one second communication hole set, the first communication hole set and the second communication hole set being in communication with the evaporating portion and the condensing portion, the evaporating portion, the condensing portion and the connecting portion defining a liquid-guiding structure; and coating at least one hydrophilic compound film on surfaces of the liquid-guiding structure.

12. The method according to claim 11, wherein the heat-dissipating unit is any one of a vapor chamber, a flat heat pipe and a loop heat pipe.

13. The method according to claim 11, wherein the hydrophilic compound film is coated on the heat-dissipating unit by any one of a physical vapor deposition process, a chemical vapor deposition process, and a sol gel process.

14. The method according to claim 13, wherein the sol gel process is performed by any one of precipitating, spin coating, brushing, wetting and soaking.

* * * * *